United States Patent [19]

Vilms

[11] 3,890,699

[45] June 24, 1975

[54] METHOD OF MAKING AN OHMIC CONTACT TO A SEMICONDUCTOR MATERIAL

[75] Inventor: Juri Vilms, Palo Alto, Calif.

[73] Assignee: The United States of America as represented by the Secretary of the Army, Washington, D.C.

[22] Filed: June 4, 1974

[21] Appl. No.: 476,250

[52] U.S. Cl. .................................... 29/590; 357/67
[51] Int. Cl.² .......................................... B01J 17/00
[58] Field of Search ........ 29/589, 590, 591; 357/67; 148/1.5

[56] References Cited

UNITED STATES PATENTS

| | | | |
|---|---|---|---|
| 3,428,450 | 2/1969 | Ginsberg | 357/67 |
| 3,728,785 | 4/1973 | Schmidt | 357/67 |
| 3,753,804 | 8/1973 | Tijburg | 357/67 |

OTHER PUBLICATIONS

Journal of Applied Physics, Vol. 40, No. 11, Oct. 1969, pp. 4575–4581, Harris et al.

*Primary Examiner*—W. Tupman
*Attorney, Agent, or Firm*—Nathan Edelberg; Robert P. Gibson; Roy E. Gordon

[57] ABSTRACT

An ohmic contact to N-type gallium arsenide is made by depositing respective layers of gold, silver, and germanium on the gallium arsenide surface and alloying the three layer structure in an inert atmosphere and at a temperature in the range of 460° to 490°C for one to ten minutes.

2 Claims, No Drawings

METHOD OF MAKING AN OHMIC CONTACT TO A SEMICONDUCTOR MATERIAL

BACKGROUND OF THE INVENTION

This invention relates in general to a method of making an ohmic contact to a semiconductor material and in particular, to a method of making an ohmic contact to N-type gallium arsenide.

N-type gallium arsenide is an important semiconductor material because of the high mobility of its carriers which enables it to be used in various devices such as Gunn effect devices, field effect transistors, and other microwave devices. One of the difficulties with presently known ohmic contacts to N-type gallium arsenide such as the gold-tin and gold-germanium contacts is that they exhibit nonuniform wetting and also balling-up of the liquid. The causes are that the first phase change upon heating does not involve the gallium arsenide, and that liquid solutions that are predominantly gold tend to have a high ratio of surface tension to adhesion to solid gallium arsenide. These problems can be overcome to some extent by using overlayers of silicon dioxide or nickel and very short alloying time duration. However, these techniques are not completely reliable. Diffusion type contacts such as gold-germanium on nickel chromium have also been tried but they suffer from balling-up of the liquid gold-germanium solution.

SUMMARY OF THE INVENTION

The general object of the invention is to provide a method of making an ohmic contact to N-type gallium arsenide. A further object is to provide such a method using a low alloying temperature so that the resulting contact has a smoother and continuous metal surface, in addition to low resistance and thermocompression-bondability.

The foregoing objects have been attained by providing a method wherein respective layers of gold, silver and germanium are deposited on the gallium arsenide surface, and the resulting three layer structure then alloyed in an inert atmosphere.

Besides gallium arsenide, the method should produce superior ohmic contacts to most n-type III–V compound semiconductors, and alloys of such semiconductors including gallium phosphide, indium phosphide, indium arsenide and gallium arsenide phosphide.

DESCRIPTION OF THE PREFERRED EMBODIMENT

An ohmic contact to N-type gallium arsenide is prepared by vacuum depositing a gold layer on the gallium arsenide surface. A silver layer is then vacuum deposited on the gold layer, and a germanium layer deposited on the silver layer. The resulting three layer structure is comprised of 25 to 35 weight percent gold, 35 to 45 weight percent silver, and 25 to 30 weight percent germanium. The silver layer must be greater than 800 angstroms in thickness. The three layer structure on the gallium arsenide piece is then alloyed in an inert atmosphere such as hydrogen, at a temperature in the range of 460° to 490°C for about 1 to 10 minutes.

In the aforedescribed method, the gold layer can have a thickness in the range of 0.068 to 0.095 microns, the silver layer a thickness of 0.080 to 0.103 microns, and the germanium layer a thickness of 0.111 to 0.133 microns.

The method can be explained as follows. As the temperature during the alloying cycle rises from room temperature up to 460° to 490°C, the first change which occurs is the eutectic melting of gold and gallium arsenide. When the melting reaches the gold-silver interface, the silver dissolves, as gold and silver form a continuous series of solid or liquid solutions. When the melting reaches the silver-germanium interface, the germanium dissolves, as it forms a liquid solution with gold above a temperature of 356°C. The surface tension of the gold-silver-germanium-gallium arsenide liquid solution is lower than its adhesion to solid gallium arsenide, and therefore no balling-up of the liquid occurs.

I wish it to be understood that I do not desire to be limited to the exact details of construction shown and described, for obvious modifications will occur to a person skilled in the art.

What is claimed is:

1. Method of making an ohmic contact to N-type gallium arsenide including the steps of a. depositing a layer of gold on the gallium arsenide surface, a layer of silver on said gold layer, said silver layer being at least 0.080 microns thick, and a layer of germanium on said silver layer wherein the three layer structure has the composition about 25 to 35 weight percent gold, about 35 to 45 weight percent silver and about 25 to 30 weight percent germanium, and b. alloying the three layer structure in an inert atmosphere and at a temperature in the range of 460° to 490°C for 1 to 10 minutes.

2. Method according to claim 1 wherein the gold layer has a thickness in the range of 0.068 to 0.095 microns, the silver layer a thickness of 0.080 to 0.103 microns, and the germanium layer a thickness of 0.111 to 0.133 microns.

* * * * *